United States Patent
Lee et al.

(10) Patent No.: US 9,773,996 B2
(45) Date of Patent: Sep. 26, 2017

(54) TRANSPARENT CONDUCTIVE FILM, AND ORGANIC LIGHT-EMITTING DEVICE COMPRISING SAME

(71) Applicant: LG CHEM, LTD., Seoul (KR)

(72) Inventors: Yeon Keun Lee, Daejeon (KR); Jungdoo Kim, Daejeon (KR); Jihee Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/436,831

(22) PCT Filed: Nov. 14, 2012

(86) PCT No.: PCT/KR2012/009583
§ 371 (c)(1),
(2) Date: Apr. 17, 2015

(87) PCT Pub. No.: WO2014/077422
PCT Pub. Date: May 22, 2014

(65) Prior Publication Data
US 2015/0340644 A1 Nov. 26, 2015

(30) Foreign Application Priority Data
Nov. 14, 2012 (KR) .................. 10-2012-0128556

(51) Int. Cl.
*H01L 51/52* (2006.01)
*C01G 19/00* (2006.01)
*H05B 33/26* (2006.01)

(52) U.S. Cl.
CPC ........ *H01L 51/5234* (2013.01); *C01G 19/006* (2013.01); *H01L 51/5206* (2013.01);
(Continued)

(58) Field of Classification Search
CPC ............ H01L 51/5234; H01L 51/5268; H01L 51/5275; H01L 51/5206; H05B 33/02;
(Continued)

(56) References Cited

U.S. PATENT DOCUMENTS 6,188,176 B1   2/2001 Nakaya et al.
6,316,343 B1 * 11/2001 Wada .................... C23C 14/086
                                          438/584

(Continued)

FOREIGN PATENT DOCUMENTS

CN   101114699 A   1/2008
CN   101978781 A   2/2011
(Continued)

OTHER PUBLICATIONS

"Electrical, optical, and structural properties of indium-tin-oxide thin films for organic light-emitting devices", Journal of Applied Physics, vol. 86, No. 11, pp. 6451-6461.

(Continued)

*Primary Examiner* — Caridad Everhart
(74) *Attorney, Agent, or Firm* — Dentons US LLP

(57) ABSTRACT

The present invention relates to a transparent conducting film and an organic light emitting device comprising the same. The transparent conducting film according to the present invention has a low surface resistance value, a high front surface transmittance and a low light absorptance. The light emission efficiency of the organic light emitting device according to the present invention may be enhanced by comprising a transparent conducting film having low light absorptance. In particular, the organic light emitting device according to the present invention may additionally comprise an internal light extraction layer to improve the light extraction efficiency, and the loss of light generated by the (Continued)

difference between refractive indices of a transparent electrode and a substrate may be minimized.

7 Claims, 6 Drawing Sheets

(52) U.S. Cl.
CPC ...... *H01L 51/5268* (2013.01); *H01L 51/5275* (2013.01); *H05B 33/26* (2013.01); *C01P 2006/40* (2013.01); *C01P 2006/60* (2013.01)

(58) Field of Classification Search
CPC ... H05B 33/26; C01G 19/006; C01P 2006/40; C01P 2006/60
USPC .............................. 438/608, 609; 423/594.9
See application file for complete search history.

(56) References Cited

U.S. PATENT DOCUMENTS

| | | | |
|---|---|---|---|
| 6,689,479 B2* | 2/2004 | Sakakura | G02B 1/115 428/446 |
| 6,696,177 B1* | 2/2004 | Hatwar | C09K 11/06 257/88 |
| 2004/0012742 A1* | 1/2004 | Ohnishi | G02F 1/1337 349/123 |
| 2005/0287724 A1* | 12/2005 | Wakairo | C23C 14/228 438/151 |
| 2006/0003188 A1* | 1/2006 | Ohno | C23C 14/0021 428/701 |
| 2008/0038529 A1 | 2/2008 | Nakayama et al. | |
| 2009/0052195 A1* | 2/2009 | Saneto | G02B 5/0278 362/355 |
| 2009/0224660 A1* | 9/2009 | Nakanishi | H01L 51/5262 313/504 |
| 2009/0284128 A1* | 11/2009 | Shinohara | H01L 27/3211 313/498 |
| 2011/0001159 A1 | 1/2011 | Nakamura et al. | |
| 2011/0114931 A1 | 5/2011 | Lee et al. | |
| 2012/0228591 A1* | 9/2012 | Sawabe | H01L 51/5268 257/40 |
| 2012/0315439 A1 | 12/2012 | Nakayama | |
| 2013/0286659 A1 | 10/2013 | Lee et al. | |
| 2014/0014923 A1 | 1/2014 | Jang et al. | |
| 2014/0126064 A1* | 5/2014 | Kishi | G02B 5/0278 359/601 |

FOREIGN PATENT DOCUMENTS

| | | |
|---|---|---|
| EP | 0892590 A2 | 1/1999 |
| EP | 2278852 A1 | 1/2011 |
| JP | 11-87068 A | 3/1999 |
| JP | 2007-141755 A | 6/2007 |
| JP | 2010129184 A | 6/2010 |
| KR | 10-2005-0092712 A | 9/2005 |
| KR | 10-2011-0054841 A | 5/2011 |
| KR | 10-1114916 B1 | 2/2012 |
| TW | 200617998 | 6/2006 |
| TW | 201144457 A1 | 12/2011 |
| WO | 2012-033322 A2 | 3/2012 |

OTHER PUBLICATIONS

"Temperature-Dependent Properties of Spray-Deposited ITO Thin Films", Journal of Thermal Spray Technology, vol. 19, No. 3, pp. 531-540.
"The correlation between preferred orientation and performance of ITO thin films", Journal of Materials Science: Materials in Electronics, vol. 18, No. 1, pp. 411-414.
"Effect of sputtering pressure and annealing temperature on the properties of indium tin oxide thin films", Materials Science and Engineering B, vol. 136, No. 1, pp. 37-40.
"Properties of Indium Tin Oxide Films Prepared by RF Magnetron Sputtering at Different Substrate Temperatures", Advanced Materials Research, vol. 502, pp. 77-81.
Kido, Junji, et al.: "Bright Organic Electroluminescent Devices with Double-Layer Cathode", IEEE Transactions on Electron Devices, vol. 40, No. 7, Jul. 1993, pp. 1342-1344.
Journal of the Optical Society of Korea, vol. 11, No. 3, Jun. 2000, pp. 152-157.
Li, Shi-tao et al: "Study on the preparation and properties of antireflective ITO thin films by magnetron sputtering", Piezoelectrics & Acoustooptics, vol. 29. pp. 115-117.
Wang, Jun et al: "Optimizing Gas Parameters of Low resistance ITO Films Prepared by DC Magnetron Sputtering", Opto-electronic Engineering, vol. 32, pp. 21-24.

* cited by examiner

[Figure 1]
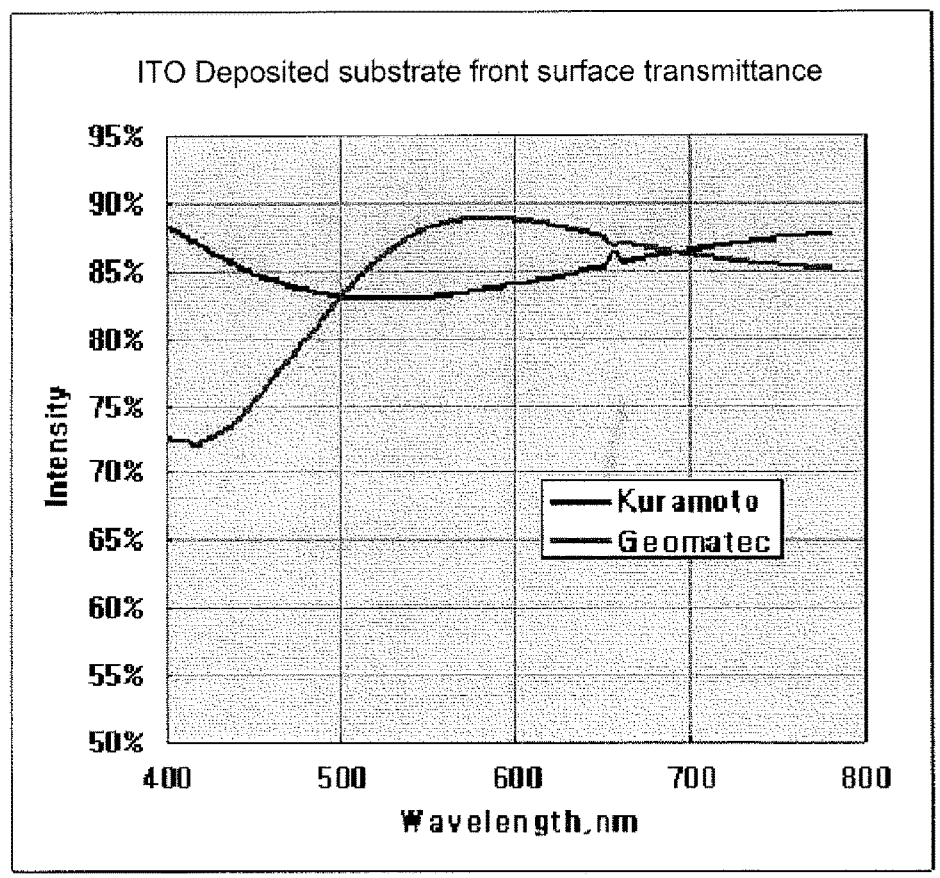
Related Art

[Figure 2]
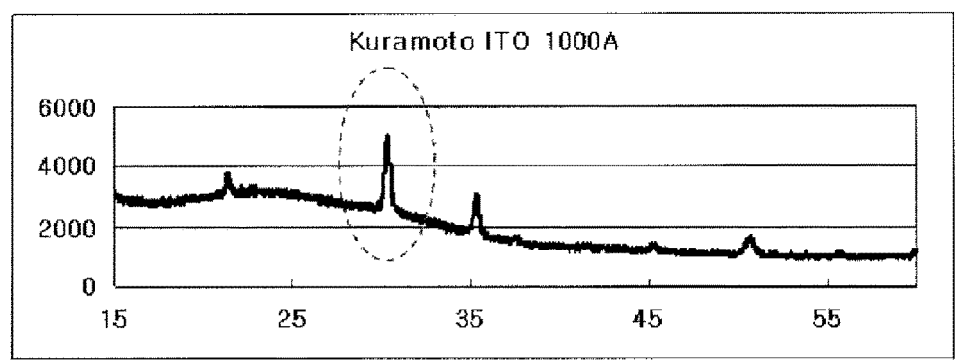
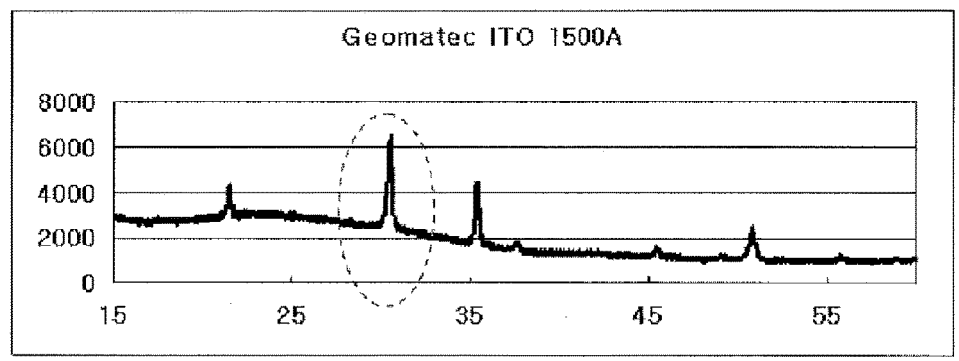
Related Art

[Figure 3]
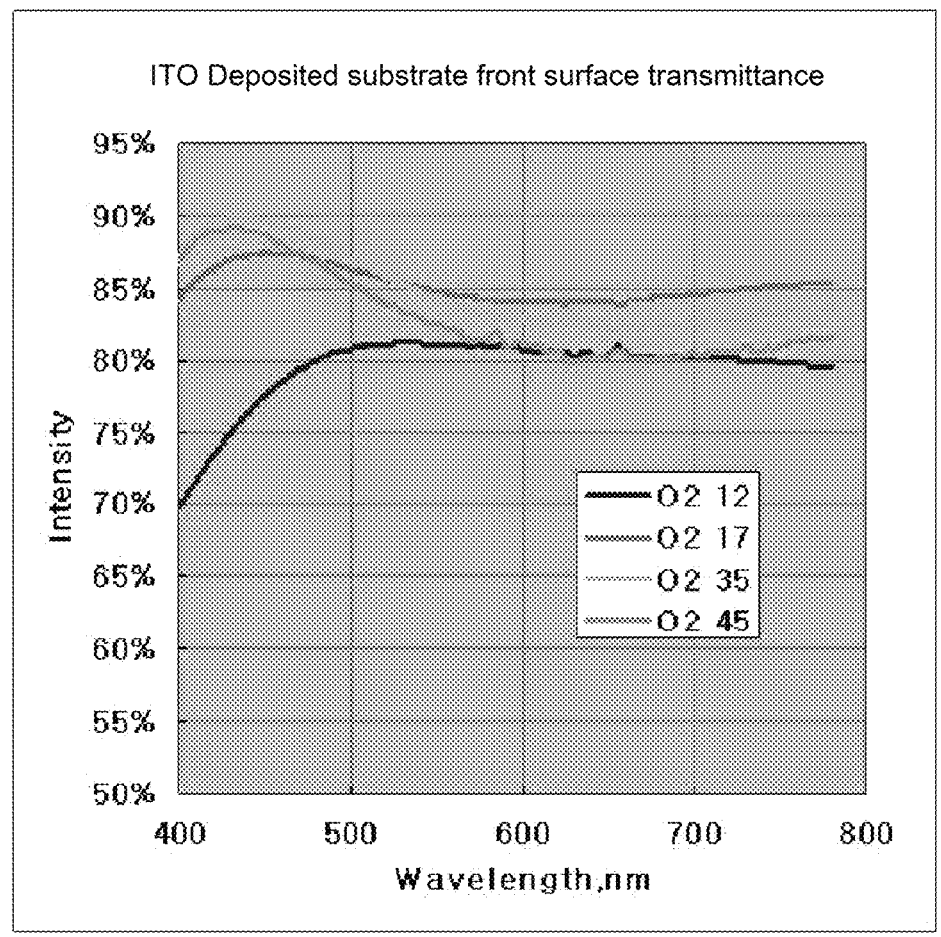

[Figure 4]
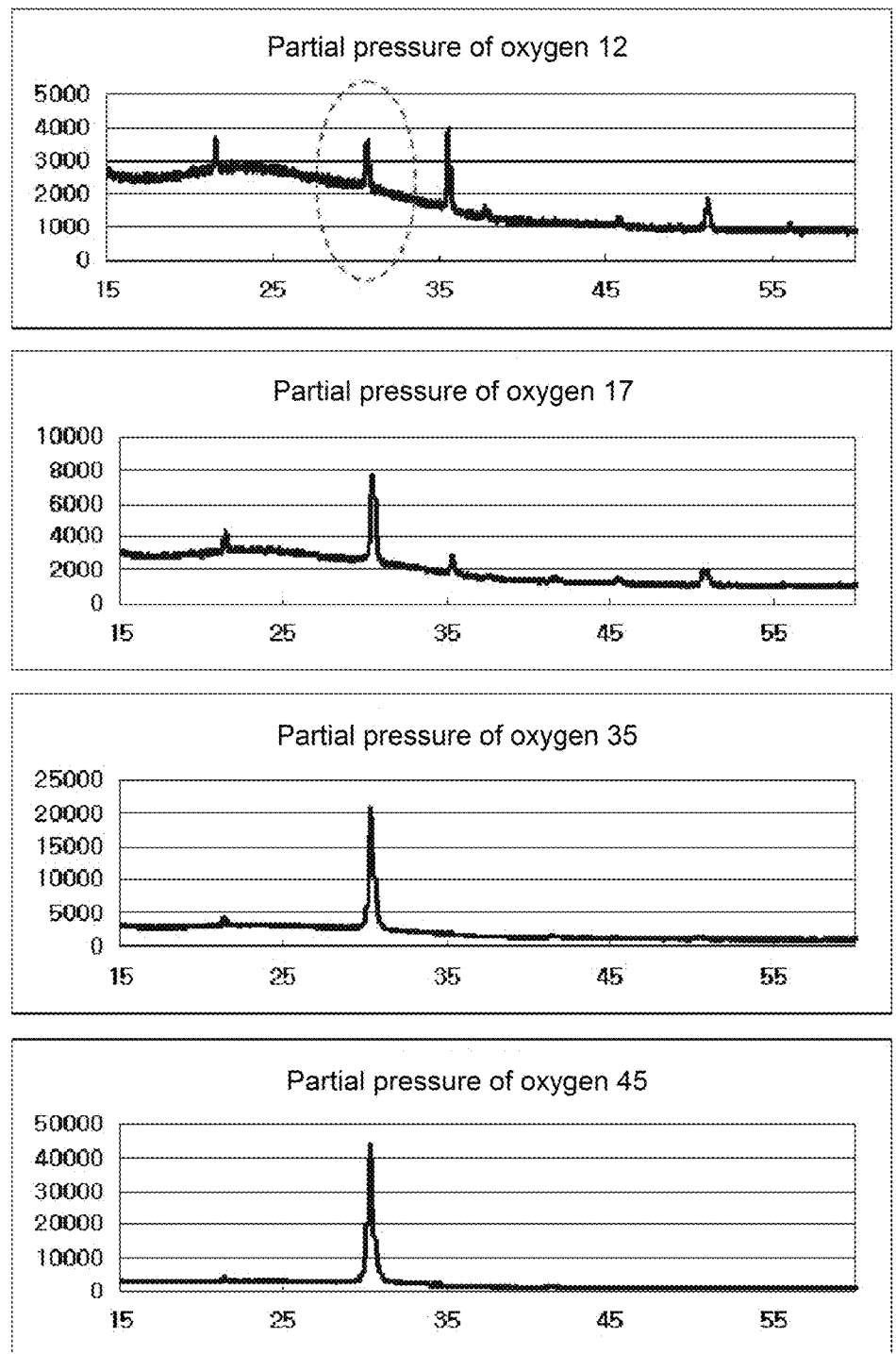

[Figure 5]
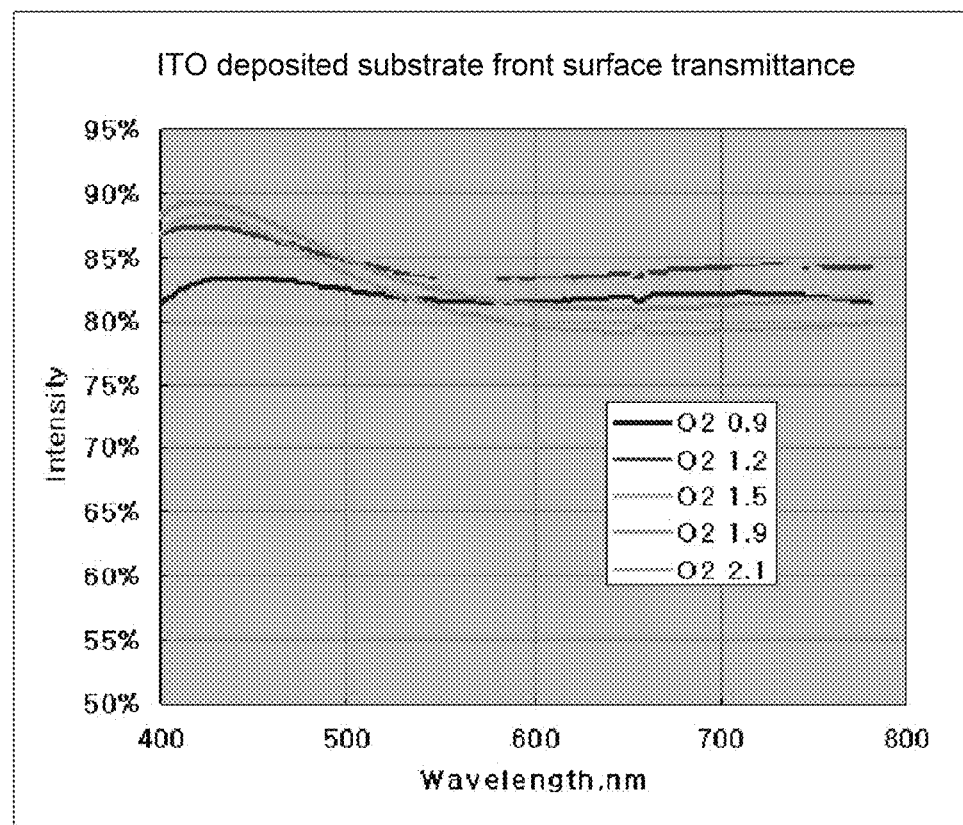

[Figure 6]
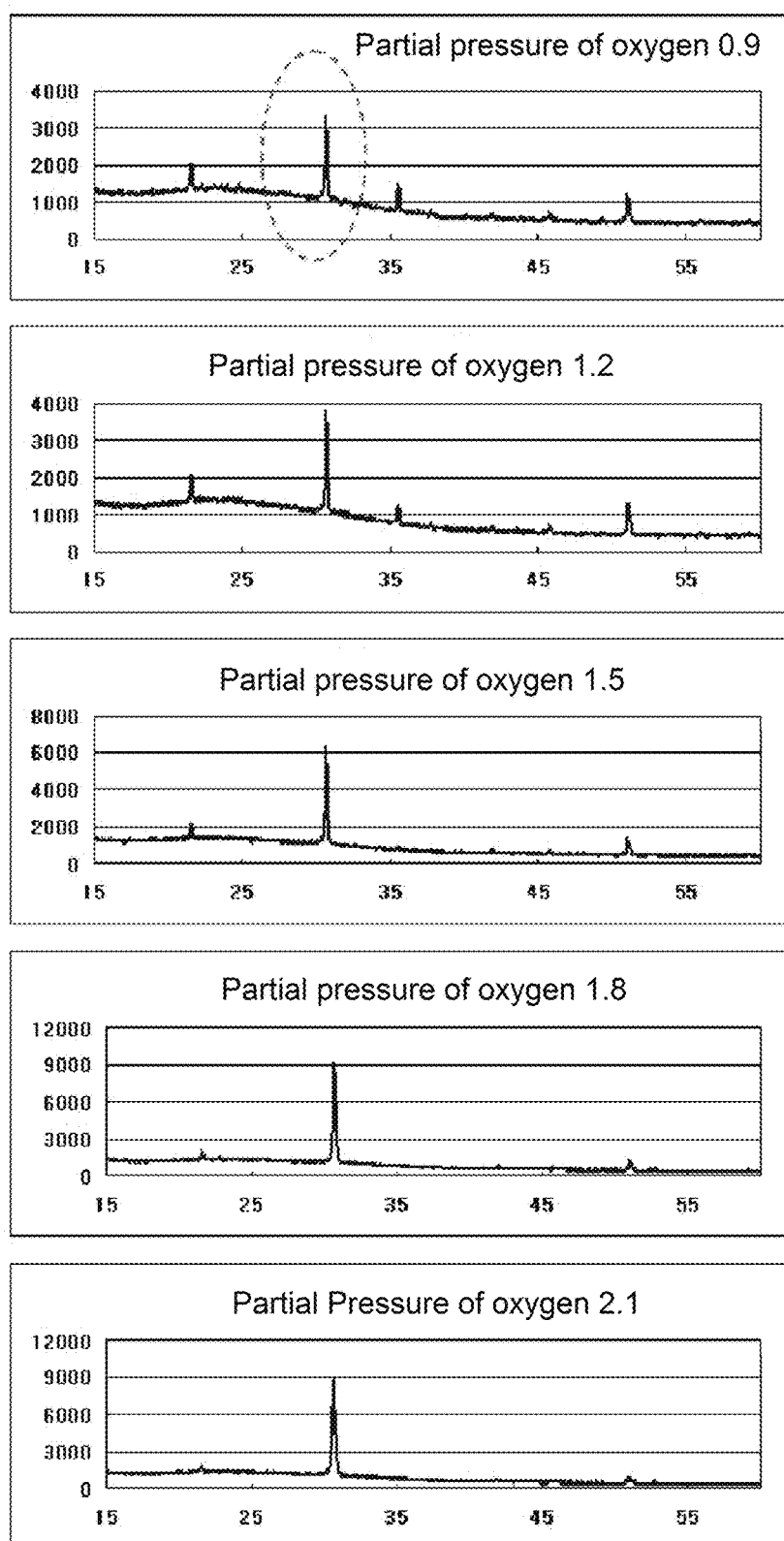

TRANSPARENT CONDUCTIVE FILM, AND ORGANIC LIGHT-EMITTING DEVICE COMPRISING SAME

This application is a National Stage Application of International Application No. PCT/KR2012/009583, filed Nov. 14, 2012, and claims the benefit of Korean Patent Application No. KR 10-2012-0128556, filed Nov. 14, 2012, all of which are hereby incorporated by reference in their entirety for all purposes as if fully set forth herein.

TECHNICAL FIELD

The present invention relates to a transparent conducting film and an organic light emitting device comprising the same.

BACKGROUND ART

An organic light emitting device (OLED) is usually composed of two electrodes and an organic material layer of one or more layers disposed between the electrodes.

If a voltage is applied between a first electrode and a second electrode in the organic light emitting device having the structure, holes and electrons flow from the first electrode and from the second electrode, respectively, into the organic material layer, the holes and electrons are recombined with each other to form an exciton, and a photon corresponding to an energy difference is emitted while the exciton falls back to the ground state. By this principle, the organic light emitting device generates visible rays, and an information display device or illumination device may be manufactured by using this.

In general, the organic light emitting device may be manufactured by a method of depositing a first electrode on a substrate, depositing an organic material layer of one or more layers thereon, and then depositing a second electrode thereon. Therefore, in order to emit light generated from the organic material layer, an electrode in a direction to which the light is to be emitted needs to be transparent, and when light is to be emitted in the first electrode direction, the first electrode and also the substrate need to be transparent.

DETAILED DESCRIPTION OF THE INVENTION

Technical Problem

In the art to which the present invention belongs, it is necessary to study an organic light emitting device that may prevent the loss of light due to the difference between refractive indices of a transparent electrode and a substrate to enhance the efficiency of the organic light emitting device, and a manufacturing method thereof.

Technical Solution

An exemplary embodiment of the present invention provides a transparent conducting film comprising: an indium tin oxide (ITO), wherein a ratio of integral intensity of a (222) plane in X-ray diffraction peaks (222), (400) and (440) is 70% or more.

Another exemplary embodiment of the present invention provides a method for preparing a transparent conducting film, which comprises forming a transparent conducting film comprising an indium tin oxide (ITO) on a substrate, wherein a ratio of integral intensity of a (222) plane in X-ray diffraction peaks (222), (400) and (440) of the transparent conducting film is 70% or more.

Yet another exemplary embodiment of the present invention provides an organic light emitting device comprising the transparent conducting film.

Advantageous Effects

The transparent conducting film according to the present invention has a low surface resistance value, a high front surface transmittance and a low light absorptance. The organic light emitting device according to the present invention may comprise a transparent conducting film having a low light absorptance to enhance the light emission efficiency. In particular, the organic light emitting device according to the present invention may additionally comprise an internal light extraction layer to improve the light extraction efficiency, and the loss of light generated by the difference between refractive indices of a transparent electrode and a substrate may be minimized.

BRIEF DESCRIPTION OF DRAWINGS

FIG. 1 is a graph showing the front surface transmittances of ITO deposited substrates in the related art.

FIG. 2 is a view illustrating the X-ray diffraction peaks of ITO deposited substrates in the related art.

FIG. 3 is a graph showing the front surface transmittances of ITO deposited substrates according to Examples 1 to 3 and Comparative Example 1 of the present invention.

FIG. 4 is a view illustrating the X-ray diffraction peaks of ITO deposited substrates according to Examples 1 to 3 and Comparative Example 1 of the present invention.

FIG. 5 is a graph showing the front surface transmittances of ITO deposited substrates according to Examples 4 to 7 and Comparative Example 2 of the present invention.

FIG. 6 is a view illustrating the X-ray diffraction peaks of ITO deposited substrates according to Examples 4 to 7 and Comparative Example 2 of the present invention.

BEST MODE

Hereinafter, the present invention will be described in detail.

In the case of illumination requiring a wide light emission area unlike displays, development is generally underway toward a structure to emit light in an anode direction. This is because it has a technical limitation to increase electrical conductivity of a transparent electrode, and thus a transparent electrode of an organic light emitting device for illumination needs a metal auxiliary electrode, and as a result, it is technically much easier to form a metal auxiliary electrode on the anode side than to form a metal auxiliary electrode on the cathode side.

In the case of an organic light emitting device in which light is emitted in an anode direction as described above, light emitted from an organic material layer passes through the anode and is emitted in the air through a substrate. As the substrate, a glass having excellent air and moisture shielding characteristics is used, and the glass usually has a refractive index of approximately 1.5. In contrast, it is known that the average refractive index of an organic material layer from which light is emitted is approximately 1.8.

When light generally proceeds from a medium having a high refractive index into a medium having a low refractive index, a phenomenon that light incident at an angle equal to or higher than a critical angle fails to pass through the medium having a low refractive index and is totally reflected occurs. Therefore, even in the case of the organic light emitting device, the refractive index of an organic material layer from which light is generated is approximately 1.8, and thus only light incident at an angle equal to or lower than a critical angle passes through a glass substrate having a refractive index of approximately 1.5, thereby generating a substantial loss of light. The phenomenon occurs even when light is emitted from the glass substrate to the air having a refractive index of 1.

Therefore, it is necessary to study an external light extraction in order to improve the efficiency of an organic light emitting device by preventing the light from being totally reflected in the transparent substrate without being released from the transparent substrate to the air layer among the loss of light generated at the interface between media having different refractive indices as described above and from being extinguished, thereby improving the efficiency of the organic light emitting device.

As an example, there is a method of modifying the surface of a flat glass substrate in order to prevent the loss of light generated at the interface between the glass substrate and the air. A substantial amount of light extinguished by the total reflection in the glass substrate by the above-described method may be recovered to improve the efficiency of the organic light emitting device. However, the method has a limitation that the effects may be exerted only on light transferred to the glass substrate among the light emitted from the organic material layer. In order to transfer all the light emitted from the organic material layer to the glass substrate, a glass substrate having a refractive index of 1.8 or more is used to remove the refractive index interface between the organic material layer and the glass substrate, but the method is not appropriate for mass production.

In order to improve the efficiency of an organic light emitting device in the related art, a device is manufactured, and then an external light extraction layer is attached to the surface of the device, or an internal light extraction layer is introduced into the device.

In an organic light emitting device into which an internal light extraction layer is introduced, the device internal progression path of light being released to the air during the driving of the organic light emitting device is elongated compared to a general organic light emitting device. Therefore, in an organic light emitting device into which the internal light extraction layer is introduced, the absorption factor of a material constituting the organic light emitting device affects the efficiency of the device more significantly than that of a general organic light emitting device.

Thus, the present inventors have confirmed that an ITO having much better transparency and lower light absorptance than an ITO applied to a general organic light emitting device needs to be applied to an organic light emitting device in which an internal light extraction layer is formed, and have found that it serves a critical role in improving the efficiency of an organic light emitting device to which an internal light extraction layer is applied to minimize the light absorptance of the ITO.

The transparent conducting film according to a specific example of the present invention comprises an indium tin oxide (ITO), in which the ratio of integral intensity of the (222) plane in X-ray diffraction peaks (222), (400) and (440) is 70% or more.

The ratio of integral intensity of the (222) plane in the X-ray diffraction peaks (222), (400) and (440) of the transparent conducting film may be measured by the following Equation 1.

The ratio of integral intensity of the (222)plane=$I_{222}/(I_{222}+I_{400}+I_{440})$ [Equation 1]

In Equation 1, $I_{222}$, $I_{400}$ and $I_{440}$ each represent the integral intensity of the X-ray diffraction peaks (222), (400) and (440) planes, respectively.

The ratio of integral intensity of the (222) plane in the X-ray diffraction peaks (222), (400) and (440) of the transparent conducting film may be 70% or more, or 80% or more.

In the present invention, the refractive index based on 550 nm of the transparent conducting film may be 1.9 or more, but is not limited thereto.

In the present invention, the surface resistance value of the transparent conducting film may be from 20Ω/□ to 100Ω/□, but is not limited thereto.

Characteristics of the ITOs manufactured by Kuramoto Co., Ltd., and Geomatec Co., Ltd., which are usually used for the illumination of an organic light emitting device in the related art were evaluated and the results are shown in the following Table 1, the front surface transmittances of the ITO-deposited substrates were evaluated and the results are shown in the following FIG. 1, and the X-ray diffraction peaks of the ITO-deposited substrates are shown in the following FIG. 2.

TABLE 1

| ITO maker | | Kuramoto | Geomatec |
|---|---|---|---|
| ITO thickness | | 1,000 Å | 1,500 Å |
| Front surface visible transmittance (bare glass) | | 83.5% | 87.3% |
| Refractive index (at 550 nm) | | 1.85 | 1.92 |
| XRD | I (222) | 51.4% | 57.4% |
| | I (400) | 29.0% | 25.3% |
| | I (440) | 19.7% | 17.3% |
| Surface resistance (Ω/□) | | 12.8 | 10.2 |

As in the results of Table 1, it can be known that an ITO usually used in the illumination of an organic light emitting device in the related art has a very low surface resistance, and the size ratio of the (222) peak in the X-ray diffraction peaks is in about 50% level when compared to those of (222), (400) and (440).

However, the transparent conducting film according to the present invention has 70% or more of the ratio of integral intensity of the (222) plane in X-ray diffraction peaks (222), (400) and (440), in which the surface resistance value is low, the front surface transmittance is high, and the light absorptance is low.

The light absorptance of the transparent conducting film according to the present invention may be 30% or less. In the present specification, the light absorptance may also be represented by the substrate absorption factor.

Further, a method for preparing the transparent conducting film according to a specific example of the present invention comprises forming a transparent conducting film comprising an indium tin oxide (ITO) on a substrate, in which the ratio of integral intensity of the (222) plane in the X-ray diffraction peaks (222), (400) and (440) of the transparent conducting film is 70% or more.

A deposition process may be used in the forming of the transparent conducting film, and the higher the partial pressure of oxygen in the deposition process, the higher the content of oxygen in the ITO gets, thereby increasing the (222) peak in the X-ray diffraction peaks. Accordingly, the surface resistance of the transparent conducting film is increased, and as the characteristics are changed as refractive index increases, the light absorptance tends to be decreased.

In addition, the organic light emitting device according to a specific example of the present invention comprises the transparent conducting film.

More specifically, the organic light emitting device may comprise a substrate, a first electrode comprising the transparent conducting film, an organic material layer of one or more layers, and a second electrode.

The present invention may additionally comprise a light extraction layer between the substrate and the first electrode.

In the present invention, the light extraction layer is not particularly limited as long as the layer has a structure in which light scattering may be induced to improve internal light extraction efficiency of the device. For example, the light extraction layer may have a refractive index of 1.7 or more, and specifically comprise a range from 1.7 to 3.0. By comprising a material having a refractive index of 1.7 or more in the light extraction layer, it is possible to obtain a light scattering effect due to the refractive index difference between one region of the material and another region having a relatively low refractive index.

As one example of the present invention, the light extraction layer may be a structure in which scattering particles are dispersed in a binder. The binder may have a refractive index higher than that of scattering particles, and it is possible to induce light scattering due to the difference in the refractive index at the interface of the binder and the scattering particles. For example, the binder may have a refractive index in a range of 1.7 or more, or from 1.7 to 3.0.

As another example, the light extraction layer comprises scattering particles and a binder, and may comprise a scattering layer on which unevenness is formed by scattering particles on the surface opposite to a surface contacting the substrate; and a flat layer which is formed on the scattering layer and flattens the surface bent due to the unevenness structure of the scattering layer. The light extraction layer may greatly exhibit the difference between refractive indices of scattering particles and the flat layer to enhance the internal light extraction efficiency. The flat layer may have a refractive index higher than that of the scattering particles, and for example, the flat layer may have a refractive index in a range of 1.7 or more, or from 1.7 to 3.0.

As yet another example, the light extraction layer may comprise a binder layer which forms an unevenness structure and is formed on a substrate; and a flat layer which is formed on the binder layer to form a flat surface. For example, the flat layer may have a refractive index in a range of 1.7 or more, or from 1.7 to 3.0.

The scattering particles may be a spherical, elliptical, or amorphous shape, and preferably a spherical or elliptical shape. The scattering particles may have an average diameter from 100 nm to 300 nm, and specifically from 150 nm to 200 nm.

The scattering particles are not particularly limited as long as the refractive index difference between the scattering particles and the binder to the flat layer may be used to scatter light, and may be one or more selected from the group consisting of air, silicon, silica, glass, titanium oxide, magnesium fluoride, zirconium oxide, alumina, cerium oxide, hafnium oxide, niobium pentoxide, tantalum pentoxide, indium oxide, tin oxide, indium tin oxide, zinc oxide, silicon, zinc sulfide, calcium carbonate, barium sulfate, silicon nitride and aluminum nitride. As an example, the scattering particles may be titanium dioxide.

The binder is not particularly limited, and may be an organic, inorganic or organic and inorganic complex binder. For example, the binder may be an inorganic or organic and inorganic complex binder. The inorganic or organic and inorganic complex binder has excellent heat resistance and chemical resistance compared to the organic binder, and thus the binder is advantageous in performance of the device, particularly, lifespan and deterioration, which may occur during the device manufacturing process, does not occur even during the high temperature process at 150° C. or more, the photo process, the etching process and the like. Therefore, the binder is advantageous in the manufacture of various devices. For example, the binder may be one or more selected from the group consisting of inorganic or organic and inorganic complexes and the like based on silicon oxide, silicon nitride, silicon oxynitride, alumina, and a siloxane bond (Si—O). For example, it is possible to form an inorganic binder based on [Si—O] bonds by using siloxane to achieve polycondensation, or to use even an organic and inorganic complex form in which alkyl groups are not completely removed from the siloxane bond.

The component constituting the flat layer may be selected in the same range as the binder constituting the scattering layer previously described. For a binder in the scattering layer and the flat layer, the same component may be used or other components may be used. Furthermore, the flat layer may further comprise a high refractive index filler which may increase the refractive index. The high refractive index filler is not particularly limited as long as the filler may be dispersed in a light extraction layer to increase the refractive index, and may be one or more selected from the group consisting of alumina, aluminum nitride, zirconium oxide, titanium oxide, cerium oxide, hafnium oxide, niobium pentoxide, tantalum pentoxide, indium oxide, tin oxide, indium tin oxide, zinc oxide, silicon, zinc sulfide, calcium carbonate, barium sulfate and silicon nitride. As an example, the high refractive filler may be titanium dioxide.

The high refractive filler may have an average particle diameter from 5 nm to 30 nm, and specifically from 10 nm to 25 nm. When the particle diameter of the high refractive filler is extremely small, it is difficult to disperse the filler in a solution, and as a result, the stability of a coating solution may deteriorate, and in the opposite case, transparency may be reduced or the surface after coating may become rough.

In general, an internal total reflection occurs in the organic light emitting device due to the refractive index difference among each layer constituting the device, thereby making it possible to aggravate the light emission efficiency and reduce the luminance. In the present invention, the internal light extraction efficiency is improved by forming a light extraction layer comprising scattering particles on a substrate.

The light extraction layer may be formed limitedly in a light emission region of the device toward a surface on which the device is deposited. Further, the light extraction layer may be a structure in which the light extraction layer is sealed by the substrate and the anode.

In the organic light emitting device in the related art, external air (for example, oxygen) or moisture may penetrate into the device through a path in which the light extraction layer is formed. The oxygen or moisture flowing into the device is responsible for reducing the service life of the device. However, in order to block oxygen or moisture from flowing into the device due to formation of a light extraction layer, the light extraction layer has a structure in which the layer is formed limitedly in a light emission region of the device, or is sealed by the substrate and the anode, and thus external air or moisture may be effectively prevented from penetrating into the device.

In the present invention, the light extraction layer may be formed on a substrate by using a coating solution comprising scattering particles and a binder. The scattering particles form a structure in which the particles are dispersed in the binder. The refractive index of the binder is not particularly limited, but may be, for example, 1.7 or more.

As another example, the light extraction layer may be formed by using a method comprising: using a coating solution comprising scattering particles and a binder on a substrate to form a scattering layer; and forming a flat layer on the formed scattering layer. The refractive index of the flat layer is not particularly limited, but may be, for example, 1.7 or more.

As yet another example, the light extraction layer may be formed by using a method comprising: forming an unevenness structure on a substrate through micro-embossing; and forming a flat layer which flattens the surface on the formed unevenness structure. For example, the unevenness structure is formed by applying a coating solution comprising a binder on a substrate and subjecting the substrate to a micro-embossing process. Thereafter, a relatively high refractive index flat layer may be formed on the formed unevenness structure to constitute a light extraction layer. The refractive index of the flat layer may be, for example, 1.7 or more.

In the present invention, the light extraction layer may be implemented by CVD (chemical vapor deposition), PVD (physical vapor deposition) or a sol-gel coating, and the method is not particularly limited.

Further, the present inventors have confirmed that the loss of light frequently occurs even in the cathode, and have studied a method for preventing the loss of light generated from the cathode.

The organic light emitting device according to a specific example of the present invention sequentially comprises a substrate, an anode comprising the transparent conducting film, an organic material layer of one or more layers, a first cathode comprising a first metal, and a second cathode comprising a second metal, in which based on a wavelength of 550 nm, the refractive index ($n_1$) of the first metal is in a range of the following Equation 2, the absorptivity coefficient (k) of the first metal is in a range of 5 or less, and a light extraction layer is comprised between the substrate and the anode.

$$23.73-\sqrt{500-k^2}-0.2 < n_1 < 23.73-\sqrt{500-k^2}+0.2 \qquad \text{[Equation 2]}$$

In Equation 2, n1 represents the refractive index of the first metal and k represents the absorptivity coefficient of the first metal.

The organic light emitting device according to a specific example of the present invention may comprise a cathode with a double-layer structure to increase the reflectance of the cathode, and accordingly, it is possible to minimize the loss of light generated due to the refractive index difference between a transparent electrode and a substrate and to enhance the light emission efficiency of an organic light emitting device, particularly, an organic light emitting device used for illumination. In particular, in the present invention, the loss of light may be minimized by comprising a first metal having a low absorption factor and a high reflectance in a first cathode contacting an organic material layer.

The reflectance (R) of light incident on the front surface of the metal may be calculated by the following Equation 3.

$$R = \frac{(n-n_0)^2 + k^2}{(n+n_0)^2 + k^2} \qquad \text{[Equation 3]}$$

In Equation 3, n0 represents the refractive index of the entrance medium, n is the refractive index of the metal, and k represents the absorption coefficient of the metal.

According to Equation 3, it can be known that as the refractive index (n) of the metal approaches 0, the reflectance of the metal is increased, and as the absorptivity coefficient (k) of the metal is increased, the reflectance is increased. In addition, as the refractive index of the entrance medium is increased, the reflectance of the metal is decreased, and thus the metal is disadvantageous in an organic light emitting device.

Thus, in the organic light emitting device according to the present invention, the refractive index ($n_1$) of the first metal is in a range of the following Equation 2 and the absorptivity coefficient (k) of the first metal is in a range of 5 or less, based on a wavelength of 550 nm.

$$23.73-\sqrt{500-k^2}-0.2 < n_1 < 23.73-\sqrt{500-k^2}+0.2 \qquad \text{[Equation 2]}$$

In the present invention, the first cathode comprising the first metal may have a structure of contacting the organic material layer of one or more layers.

The first metal comprised in the first cathode and the second metal comprised in the second cathode may be different metals.

Examples of the first metal comprise Cu, Au, Li, Ag and the like, but are not limited thereto.

The thickness of the first cathode may be from 1 nm to 100 nm and from 1 nm to 50 nm, but is not limited thereto.

The reflectance of light incident on the front surface of the first cathode may be 70% or more and 80% or more, but is not limited thereto. Here, the reflectance may be calculated by Equation 2.

In the present invention, specific materials and formation methods for the second cathode are not particularly limited, and materials and formation methods widely known in the art may be used.

The second cathode comprises the second metal, and the second metal may be one or more selected from magnesium, calcium, sodium, potassium, titanium, indium, yttrium, lithium, gadolinium, aluminum, silver, platinum, gold, tungsten, tantalum, copper, tin and lead. Furthermore, the second metal is preferably aluminum or silver.

The thickness of the second cathode may be from 50 nm to 5 μm, but is not limited thereto.

Al has a refractive index of 1.015 at 550 nm, and an absorptivity coefficient of 6.627. The reflectance of the surface of Al in the air having a refractive index of 1 is at a level of 91.5% according to Equation 3, which is a very high value.

However, under an environment to which an OLED is applied, the reflected surface of Al does not contact the air, but an organic material having a refractive index of about 1.8. At this time, the reflectance of Al is reduced to 85.9%. In an OLED to which an internal light extraction layer is applied, light is reflected on the surface of Al while circulating the organic material layer several times, and at each time of the reflection, light is lost by about 14%. When the loss is reduced, the extraction effect through an internal light extraction layer is increased, and thus it is very important not only to develop an internal light extraction layer, but also to reduce the absorption factor of the OLED itself.

Among the metals, Ag exists almost alone as a metal having a reflectance higher than that of Al. It is confirmed that the efficiency is increased in the case of applying an OLED in which Ag having a reflectance higher than that of Al is applied to an internal light extraction layer, but an OLED using an Ag cathode is electrically unstable and it is highly likely that shorts occur in an illumination device composed of a single cell, which is wider than a display by several thousand times, and thus the OLED is not still appropriate for mass-production. The probability of short occurrence is a phenomenon linked to the case in which the cathode and the anode are at a low-resistance level due to defects on the substrate of the device, and the probability of occurrence of defects is proportional to the area of a substrate, and the OLED is particularly disadvantageous in an illumination in which a single cell is formed to have a very large area.

In the present invention, a first metal having a refractive index and an absorptivity coefficient in the range described above in front of the Al cathode is formed with a thin thickness, and it is possible to obtain a reflectance higher than that of the first metal itself or Al by the configuration.

The first cathode and the second cathode may be formed by using any one physical vapor deposition (PVD) selected from sputtering, E-beam evaporation, thermal evaporation, laser molecular beam epitaxy (L-MBE), and pulsed laser deposition (PLD); any one chemical vapor deposition selected from thermal chemical vapor deposition, plasma-enhanced chemical vapor deposition (PECVD), light chemical vapor deposition, laser chemical vapor deposition, metal-organic chemical vapor deposition (MOCVD), and hydride vapor phase epitaxy (HVPE); or atomic layer deposition (ALD).

In particular, in the present invention, the first metal may be Li and the second metal may be Al or Ag.

In the present invention, as the substrate, a substrate known in the art may be used without limitation, and more specific examples thereof comprise a glass substrate, a plastic substrate and the like, but are not limited thereto.

The present invention may additionally comprise an auxiliary electrode in order to improve the resistance of the anode. The auxiliary electrode may be formed by depositing one or more selected from the group consisting of conducting sealants and metals, and then using a photo process or a printing process. More specifically, the auxiliary electrode may comprise Cr, Mo, Al, Cu, an alloy thereof and the like, but is not limited thereto.

The present invention may additionally comprise an insulating layer on the auxiliary electrode. The insulating layer may be formed by using a material and a method known in the art. More specifically, the insulating layer may be formed by using a general photoresist material; polyimide; polyacryl; silicon nitride; silicon oxide; aluminum oxide; aluminum nitride; an alkali metal oxide; an alkaline earth metal oxide, and the like, but is not limited thereto. The thickness of the insulating layer may be from 10 nm to 10 μm, but is not limited thereto.

Specific materials and formation methods for the organic material layer are not particularly limited, and materials and formation methods widely known in the art may be used.

The organic material layer may be manufactured with fewer layers by using various polymer materials by a solvent process other than a deposition method, for example, a method, such as spin coating, dip coating, doctor blading, screen printing, inkjet printing, thermal transfer or the like.

The organic material layer according to the present invention may have a stacked structure in which the organic material layer comprises a light emitting layer, and one or more selected from a hole injection layer, a hole transporting layer, an electron transporting layer and an electron injection layer.

In the present invention, a material capable of forming the hole injection layer is preferably a material having a large work function such that the injection of holes into the organic material layer may be usually facilitated. Specific examples of the hole injection material which may be used in the present invention comprise metals such as vanadium, chromium, copper, zinc and gold, or alloys thereof; metal oxides such as zinc oxide, indium oxide, indium tin oxide (ITO) and indium zinc oxide (IZO); a combination of metal and oxide, such as $ZnO:Al$ or $SnO_2:Sb$; electrically conductive polymers, such as poly(3-methylthiophene), poly[3,4-(ethylene-1,2-dioxy)thiophene] (PEDT), polypyrrole and polyaniline, and the like, but are not limited thereto.

In the present invention, a material capable of forming the electron injection layer is preferably a material having a small work function such that electrons are usually easily injected into the organic material layer. Specific examples of the electron injection material comprise metals such as magnesium, calcium, sodium, potassium, titanium, indium, yttrium, lithium, gadolinium, aluminum, silver, tin and lead, or alloys thereof; multi-layer structured materials such as $LiF/Al$ or $LiO_2/Al$, and the like, the same material as the hole injection electrode material may be used, but the materials are not limited thereto.

In the present invention, a material capable of forming the light emitting layer is a material that is capable of emitting light in a visible ray region by accepting and recombining holes from the hole transporting layer and electrons from the electron transporting layer, respectively, and is preferably a material having high quantum efficiency for fluorescence and phosphorescence. Specific examples thereof comprise 8-hydroxy-quinoline-aluminum complex ($Alq_3$); carbazole-based compounds; dimerized styryl compounds; BAlq; 10-hydroxybenzoquinoline-metal compounds; benzoxazole-based, benzthiazole-based and benzimidazole-based compounds; poly(p-phenylenevinylene) (PPV)-based polymers; spiro compounds; polyfluorene and rubrene; phosphorescence host CBP[[4,4'-bis(9-carbazolyl)biphenyl] and the like, but are not limited thereto.

Further, the light emission material may additionally comprise a phosphorescent dopant or fluorescent dopant in order to improve fluorescent or phosphorescent characteristics. Specific examples of the phosphorescent dopant comprise ir(ppy)(3)[fac tris(2-phenylpyridine) iridium], F2Irpic [iridium(III)bis(4,6,-di-fluorophenyl-pyridinato-N,C2) picolinate] or the like. As the fluorescent dopant, materials known in the art may be used.

In the present invention, as a material capable of forming the electron transporting layer, a material which may receive electrons from the electron injection layer and transport the electrons to the light emitting layer well and having high mobility to electrons is suitable. Specific examples thereof comprise aluminum complexes of 8-hydroxyquinoline; complexes comprising $Alq_3$; organic radical compounds; hydroxyflavone-metal complexes, and the like, but are not limited thereto.

The organic light emitting device according to the present invention may be more preferably applied to an organic light emitting device for illumination.

BEST MODE

Hereinafter, preferred Examples will be provided for better understanding of the present invention. However, the following Examples are provided for illustrative purposes only, and the scope of the present invention should not be limited thereto in any manner.

EXAMPLES

Comparative Example 1

1) Deposition of ITO on Glass Substrate

The following deposition apparatus and deposition condition were used to deposit ITO on a glass substrate.
<Deposition Apparatus and Deposition Conditions>
Manufacturing Company: Sumitomo Heavy Industry Co., Ltd.
Power: 200 A, from 60 V to 70 V
Deposition Atmosphere: Ar (90), $O_2$ (12)
Deposition Conditions: 250° C. High Temperature Deposition
Target: $In_2O_3$:$SnO_2$=95:5 wt %
Film-Formation Thickness: About 1,000 Å
The characteristics of the ITO prepared above were evaluated and described in the following Table 2.

2) Deposition of ITO on Light Extraction Layer

An internal light extraction layer was formed on a glass substrate, and then the deposition apparatus and deposition conditions in 1) were used to deposit an ITO thereon. Thereafter, a photo process was performed and an organic light emitting device was manufactured.

Preparation of Internal Light Extraction Layer $TiO_2$ particles having an average particle diameter of about 200 nm were sufficiently dispersed in a siloxane binder solution to prepare a coating solution. The prepared coating solution was applied on a glass substrate to form a scattering layer. Thereafter, a siloxane binder (a refractive index of about 1.8 after drying), in which a high refractive index filler ($TiO_2$) having an average particle diameter of about 10 nm was dispersed, was coated on the scattering layer to form a high refractive index coating layer having a flat surface. Through this, a light extraction layer was formed on the glass substrate.

Manufacture of Organic Light Emitting Device

A first transparent electrode, an organic material layer and a second electrode were sequentially stacked on the prepared internal light extraction layer to manufacture a white OLED having a light emitting region of 40×40 $mm^2$. ITO (Indium Tin Oxide) was used to form the first transparent electrode, and aluminum (Al) was used to form the second electrode. In addition, the organic layer was formed as a structure comprising a hole injection layer, an hole transferring layer, an organic light emitting layer, an electron transferring layer and an electron injection layer. As the materials used in each stacked structure, materials typically used in the manufacturing field of white OLEDs were used, and as the formation method thereof, a general method was also used.

The characteristics of the organic light emitting device manufactured above were evaluated and described in the following Table 3.

Examples 1 to 3

1) Deposition of ITO on Glass Substrate

An experiment was performed in the same manner as in Comparative Example 1, except that the partial pressure of oxygen was controlled as described in the following Table 2 in Comparative Example 1.

2) Deposition of ITO on Light Extraction Layer

An experiment was performed in the same manner as in Comparative Example 1, except that the partial pressure of oxygen was controlled as described in the following Table 3 in Comparative Example 1.

The front surface transmittances of the ITO deposited substrates according to Examples 1 to 3 and Comparative Example 1 are shown in the following FIG. 3, and the X-ray diffraction peaks of the ITO deposited substrates are shown in the following FIG. 4.

TABLE 2

|  | Comparative Example 1 | Example 1 | Example 2 | Example 3 |
|---|---|---|---|---|
| Partial pressure of oxygen | 12 | 17 | 35 | 45 |
| Front surface visible transmittance (bare glass) | 80.8% | 84.8% | 84.3% | 82.4% |
| Refractive index (at 550 nm) | 1.88 | 1.88 | 1.97 | 2.03 |
| XRD Peak ratio  I (222) | 29.87% | 74.70% | 97.06% | 100.00% |
| I (400) | 46.52% | 9.84% | — | — |
| I (440) | 23.61% | 15.46% | 2.94% | — |
| Surface resistance (Ω/□) | 12.4 | 12.8 | 21.0 | 37.7 |

TABLE 3

|  | Comparative Example 1 | Example 1 | Example 2 | Example 3 |
|---|---|---|---|---|
| Partial pressure of oxygen | 12 | 17 | 35 | 45 |
| Substrate absorption factor | 59.5% | 29.8% | 15.06% | 13.4% |
| Device efficiency (lm/W) | 49.5 | 53.6 | 54.4 | 54.5 |

As an apparatus which evaluated the X-ray diffraction, Bruker AXS D4 Endeavor XRD (2) was used. Furthermore, an integrating sphere was used to measure the substrate absorption factor. More specifically, if a brightness of the integrating sphere while a magnetic absorption calibration lamp in the integrating sphere is lit is defined as $L_0$, a brightness of the integrating sphere when a sample to be measured in the integrating sphere is disposed in the middle thereof is defined as Ls, and a brightness of integrating sphere when a complete absorption body having the same size as the sample in the integrating sphere is disposed in the middle thereof is defined as $L_D$, the substrate absorption factor may be calculated by the following Equation 4.

When the absorption factor of the substrate is measured, a more accurate result may be obtained by using a substrate on which an internal light extraction layer is formed as in the Examples rather than a substrate that is deposited on a transparent glass (bare glass). When a substrate on which an internal light extraction layer is formed is used, the optical path in the substrate is formed at various angles. Accordingly, the absorption factor of the ITO may be confirmed in an environment similar to the environment during the actual emission of the device, and light is absorbed in a relatively large amount, thereby increasing the discrimination between samples to be measured.

$$\text{Substrate absorption factor (\%)} = 1 - (Ls - L_D)/(L_0 - L_D) \times 100 \quad \text{[Equation 4]}$$

Comparative Example 2

1) Deposition of ITO on Glass Substrate

The following deposition apparatus and deposition condition were used to deposit ITO on a glass substrate.

<Deposition Apparatus and Deposition Conditions>
Manufacturing Company: Sunic System Co., Ltd.
Apparatus name: SUNICOAT—561L
Type: DC sputtering batch type
Power: DC 500 W
Deposition Atmosphere: 5 mm torr (Ar: 80, $O_2$: 0.9 sccm)
Deposition Conditions: deposition at room temperature, and then heat treatment 250° C. for 30 minutes
Target: Tosho MS type ($In_2O_3$:$SnO_2$=90:10 wt %)

The characteristics of the ITO prepared above were evaluated and described in the following Table 4.

2) Deposition of ITO on Light Extraction Layer

An internal light extraction layer was formed on a glass substrate, and then the deposition apparatus and deposition conditions in 1) were used to deposit an ITO thereon. Thereafter, a photo process was performed and an organic light emitting device was manufactured.

Preparation of Internal Light Extraction Layer $TiO_2$ particles having an average particle diameter of about 200 nm were sufficiently dispersed in a siloxane binder solution to prepare a coating solution. The prepared coating solution was applied on a glass substrate to form a scattering layer. Thereafter, a siloxane binder (a refractive index of about 1.8 after drying), in which a high refractive index filler ($TiO_2$) having an average particle diameter of about 10 nm was dispersed, was coated on the scattering layer to form a high refractive index coating layer having a flat surface. Through this, a light extraction layer was formed on the glass substrate.

Manufacture of Organic Light Emitting Device

A first transparent electrode, an organic material layer and a second electrode were sequentially stacked on the prepared internal light extraction layer to manufacture a white OLED having a light emitting region of 40×40 $mm^2$. ITO (Indium Tin Oxide) was used to form the first transparent electrode, and aluminum (Al) was used to form the second electrode. Furthermore, the organic layer was formed as a structure comprising a hole injection layer, a hole transferring layer, an organic light emitting layer, an electron transferring layer and an electron injection layer. As the materials used in each stacked structure, materials typically used in the manufacturing field of white OLEDs were used, and as the formation method thereof, a general method was also used.

The characteristics of the organic light emitting device manufactured above were evaluated and described in the following Table 5.

Examples 4 to 7

1) Deposition of ITO on Glass Substrate

An experiment was performed in the same manner as in Comparative Example 1, except that the partial pressure of oxygen was controlled as described in the following Table 4 in Comparative Example 2.

2) Deposition of ITO on Light Extraction Layer

An experiment was performed in the same manner as in Comparative Example 1, except that the partial pressure of oxygen was controlled as described in the following Table 5 in Comparative Example 2.

The front surface transmittances of the ITO deposited substrates according to Examples 4 to 7 and Comparative Example 1 are shown in the following FIG. 5, and the X-ray diffraction peaks of the ITO deposited substrates are shown in the following FIG. 6.

TABLE 4

|  | Comparative Example 2 | Example 4 | Example 5 | Example 6 | Example 7 |
|---|---|---|---|---|---|
| Partial pressure of oxygen | 0.9 | 1.2 | 1.5 | 1.9 | 2.1 |
| Front surface visible transmittance (bare glass) | 81.8% | 83.7% | 83.8% | 82.5% | 81.1% |
| Refractive index (at 550 nm) | 1.76 | 1.77 | 1.86 | 1.98 | 2.07 |
| XRD Peak ratio  I (222) | 61.7% | 62.4% | 83.6% | 91.2% | 92.0% |
| XRD Peak ratio  I (400) | 16.4% | 11.7% | — | — | 2.5% |
| XRD Peak ratio  I (440) | 21.9% | 25.9% | 16.4% | 8.8% | 5.5% |
| Surface resistance (Ω/□) | 26 | 29 | 43 | 76 | 143 |

TABLE 5

|  | Comparative Example 2 | Example 4 | Example 5 | Example 6 | Example 7 |
|---|---|---|---|---|---|
| Partial pressure of oxygen | 0.9 | 1.2 | 1.5 | 1.9 | 2.1 |
| Substrate absorption factor | 33.3% | 25.6% | 15.4% | 14.5% | 12.4% |
| Device efficiency (lm/W) | — | 49.9 | — | — | 58.1 |

As in the above-described results, it can be known that as the partial pressure of oxygen is increased during the deposition of the ITO, the efficiency of the device is improved, and as a result of measuring the XRD, the characteristics of the ITO tend to have an increase in the (222) peak, an increase in the surface resistance, a decrease in the substrate absorption factor, and the like.

As described above, the transparent conducting film according to the present invention has a low surface resistance value and a low light absorptance. The light emission efficiency of the organic light emitting device according to the present invention may be enhanced by comprising a transparent conducting film having low light absorptance. In particular, the organic light emitting device according to the present invention may additionally comprise an internal light extraction layer to improve the light extraction efficiency, and the loss of light generated by the difference between refractive indices of a transparent electrode and a substrate may be minimized.

The invention claimed is:

1. An organic light emitting device sequentially comprising:
   a substrate;
   an anode comprising a transparent conducting film;
   an organic material layer of one or more layers;
   a first cathode comprising a first metal;
   a second cathode comprising a second metal; and
   a light extraction layer provided between the substrate and the anode, wherein the light extraction layer comprises scattering particles and a binder, and wherein the light extraction layer comprises a scattering layer on which an unevenness is formed by scattering particles on a surface opposite to a surface contacting the substrate; and wherein the light extraction layer comprises a flat layer formed on the scattering layer and that flattens the surface bent due to the unevenness structure of the scattering layer;

wherein the light extraction layer has a structure in which the scattering particles are dispersed in the binder, the binder having a refractive index of 1.7 or more, wherein the flat layer has a structure in which particles of a high refractive index filler having an average particle diameter from 5 nm to 30 nm are dispersed in the flat layer;

wherein the transparent conducting film comprises an indium tin oxide (ITO), a ratio of integral intensity of a (222) plane in X-ray diffraction peaks (222), (400) and (440) of the transparent conducting film is 70% or more, and wherein the ratio of integral intensity of the (222) plane is measured by the following Equation 1:

$$\text{The ratio of integral intensity of the (222) plane} = I_{222}/(I_{222}+I_{400}+I_{440})$$ [Equation 1]

wherein in Equation 1, $I_{222}$, $I_{400}$ and $I_{440}$ each represent the integral intensity of the X-ray diffraction peaks (222), (400) and (440) planes, respectively.

2. The organic light emitting device of claim 1, wherein the first cathode comprising the first metal has a structure of contacting the organic material layer of one or more layers.

3. The organic light emitting device of claim 1, wherein the first metal is one selected from the group consisting of Cu, Au, Li and Ag.

4. The organic light emitting device of claim 1, wherein a thickness of the first cathode is from 1 nm to 100 nm.

5. The organic light emitting device of claim 1, wherein a thickness of the second cathode is from 50 nm to 5 μm.

6. The organic light emitting device of claim 1, wherein the first metal is Li and the second metal is Al or Ag.

7. The organic light emitting device of claim 1, wherein the organic light emitting device is for illumination.

* * * * *